(12) United States Patent
Wei et al.

(10) Patent No.: US 8,189,343 B2
(45) Date of Patent: May 29, 2012

(54) METHOD AND APPARATUS TO PROVIDE POWER TO A BACKPLANE

(75) Inventors: Wen Wei, Beaverton, OR (US); Ron W. Smith, Portland, OR (US); Jagadeesh Radhakrishnan, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 174 days.

(21) Appl. No.: 11/023,776

(22) Filed: Dec. 28, 2004

(65) Prior Publication Data

US 2006/0139904 A1    Jun. 29, 2006

(51) Int. Cl.
H05K 1/18    (2006.01)

(52) U.S. Cl. .......... 361/788; 174/255; 174/256; 439/61; 439/64

(58) Field of Classification Search .................. 361/788, 361/796, 801, 825; 439/62, 63, 61, 64; 174/255–266
See application file for complete search history.

(56) References Cited

U.S. PATENT DOCUMENTS

| | | | | |
|---|---|---|---|---|
| 5,235,629 A * | 8/1993 | Butler et al. | ..................... | 379/21 |
| 6,081,419 A * | 6/2000 | Pham | ............................. | 361/617 |
| 6,144,561 A * | 11/2000 | Cannella et al. | ............... | 361/796 |
| 6,633,835 B1 * | 10/2003 | Moran et al. | .................. | 702/190 |
| 6,693,901 B1 * | 2/2004 | Byers et al. | ..................... | 370/362 |
| 2002/0180022 A1 * | 12/2002 | Emoto | ............................. | 257/686 |
| 2004/0233652 A1 * | 11/2004 | Sandy et al. | ................... | 361/788 |
| 2005/0099772 A1 * | 5/2005 | Wei | .................................. | 361/695 |
| 2005/0141207 A1 * | 6/2005 | Campini | ........................ | 361/790 |
| 2005/0146855 A1 * | 7/2005 | Brehm et al. | .................. | 361/724 |
| 2006/0087824 A1 * | 4/2006 | Sandy et al. | ................... | 361/796 |

OTHER PUBLICATIONS

PCI Industrial Computer Manufacturers Group (PICMG), Advanced Telecommunications Computing Architecture (ATCA) Base Specification, PIGMG 3.0 Revision 1.0, published Dec. 30, 2002.

* cited by examiner

*Primary Examiner* — Kambiz Zand
*Assistant Examiner* — Abiy Getachew
(74) *Attorney, Agent, or Firm* — Caven & Aghevli LLC (57) ABSTRACT

Embodiments are generally direct to a method and apparatus to provide power to a backplane. In one embodiment, a method is implemented in a backplane to receive power through an upper zone of the backplane. The power is provided by a rear transition power entry module (RT-PEM) operatively coupled to an interface in the upper zone. The power provided by the RT-PEM is routed to interfaces in a lower zone of the backplane. Each lower zone interface distributes at least a portion of the power to a component operatively coupled to the backplane.

7 Claims, 8 Drawing Sheets

METHOD AND APPARATUS TO PROVIDE POWER TO A BACKPLANE

TECHNICAL FIELD

Embodiments of the invention generally relate to the field of electronic systems, and more particularly, to a method and apparatus to provide power to a backplane.

BACKGROUND

Modular platforms are used in a variety of applications, including but not limited to enterprise servers, telecommunication servers, flexi-servers and mass storage servers. Many of these applications may have one or more specifications that may govern various physical specifications and operating parameters of the modular platform and how components (e.g., boards, modules, backplanes, air plenums, etc.) are configured within or coupled to the modular platform. One such specification is the PCI Industrial Computer Manufacturers Group (PICMG), Advanced Telecommunications Computing Architecture (ATCA) Base Specification, PICMG 3.0 Rev. 1.0, published Dec. 30, 2002 (hereinafter referred to as "the ATCA specification").

The ATCA specification provides design criteria for modular platforms to serve as carrier grade communication equipment. This design criterion may include, but is not limited to, configurations for such components as intake/exhaust plenums, fan modules, power entry modules, boards and backplanes. Design criteria may also include configurations to couple components such as a rear interface unit (hereinafter referred to as a "rear transition module" or "RTM") to other components such as a board.

The ATCA specification also provides design criteria which constrain a modular platform to certain dimensional requirements, such as height, width and length. These constraints may impact the air flow and the consequent cooling of a modular platform. For example, to meet these constraints, modular platform components (e.g., power entry modules and/or fan modules) may be placed towards the lower part of the modular platform. Typically, backplanes designed in compliance with ATCA may only enable this type of component placement. However, since the lower part of the modular platform may include an air plenum to improve air flow and air flow is negatively impacted by this component placement, backplanes designed this way may be problematic.

BRIEF DESCRIPTION OF THE DRAWINGS

The invention is illustrated by way of example, and not by way of limitation, in the figures of the accompanying drawings in which like reference numerals refer to similar elements and in which.

DETAILED DESCRIPTION

Embodiments of the invention are generally directed to a method and apparatus to provide power to a backplane. A backplane for a modular platform is introduced herein. As described more fully below, the backplane may include a power interface to distribute power to a component coupled to the backplane. The backplane may include an interface to receive and couple a power module (e.g., a rear transition power entry module (RT-PEM)) to the backplane. The backplane may also include power circuitry to route power received from the power module to the power interface.

Figure 1:
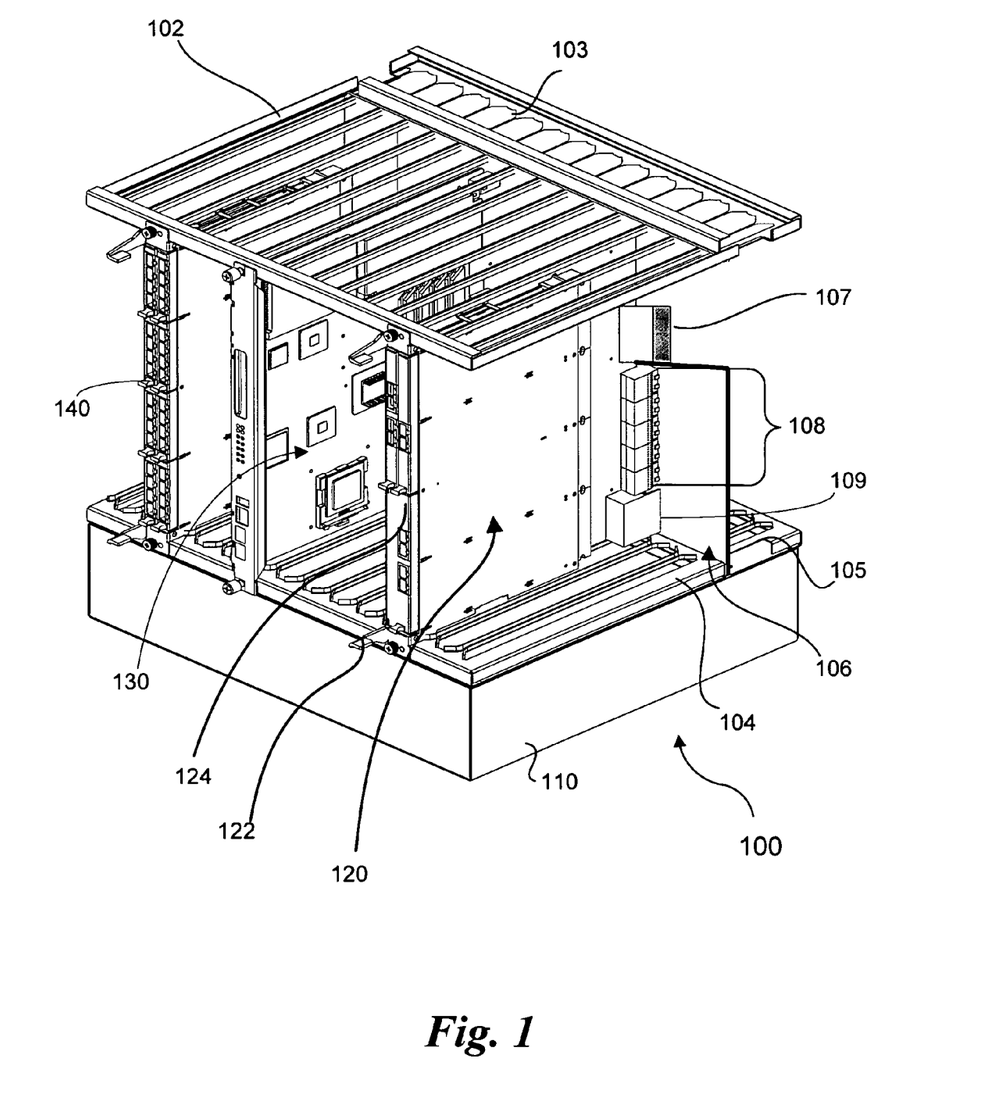
FIG. 1 provides a partial view of an example modular platform, according to one embodiment.

FIG. 1 provides a partial view of an example modular platform 100, according to one embodiment. Modular platform 100 may be a telecommunications server designed to be compliant with the ATCA Specification, although the scope of invention is not limited in this respect. FIG. 1 shows a partial view of modular platform 100 having selected portions removed for clarity.

Modular platform 100 is shown including boards 120, 130 and 140. In an example embodiment, each board may include one or more input/output (I/O) interfaces (e.g., board 120 includes I/O connectors 108) which enable the board to couple to a backplane 106. When a board (e.g., board 120) is coupled to backplane 106, these I/O interfaces may enable communication with modular platform 100 system management devices, other boards in modular platform 100 or electronic systems located remotely to modular platform 100.

Each board may also contain a power interface (e.g., board 120 includes power connectors 109) through which power is received when coupled to modular platform 100. As explained in more detail below, in an example embodiment, power may be routed to the power interface over power circuitry (not shown in FIG. 1) resident on backplane 106.

Each board may also contain a rear transition module (RTM) interface (e.g., board 120 includes RTM interface 107) to receive and couple to an RTM. In an example embodiment, when an RTM is coupled to a board, the RTM may provide additional functionality. This functionality, for example, may include the provision of additional I/O interfaces that may be used to expand the communication bandwidth of the board.

As shown, modular platform 100 may also include upper board guide 102, upper RTM guide 103, lower board guide 104 and lower RTM guide 105. The board and RTM guides may provide support for boards and RTMS when coupled to backplane 106 or to each other.

Modular platform 100 may also include lower plenum 110. Although not shown in FIG. 1, lower plenum 110 may include air intake/exhaust vents and fans to provide additional air flow and circulation within modular platform 100.

Figure 2:
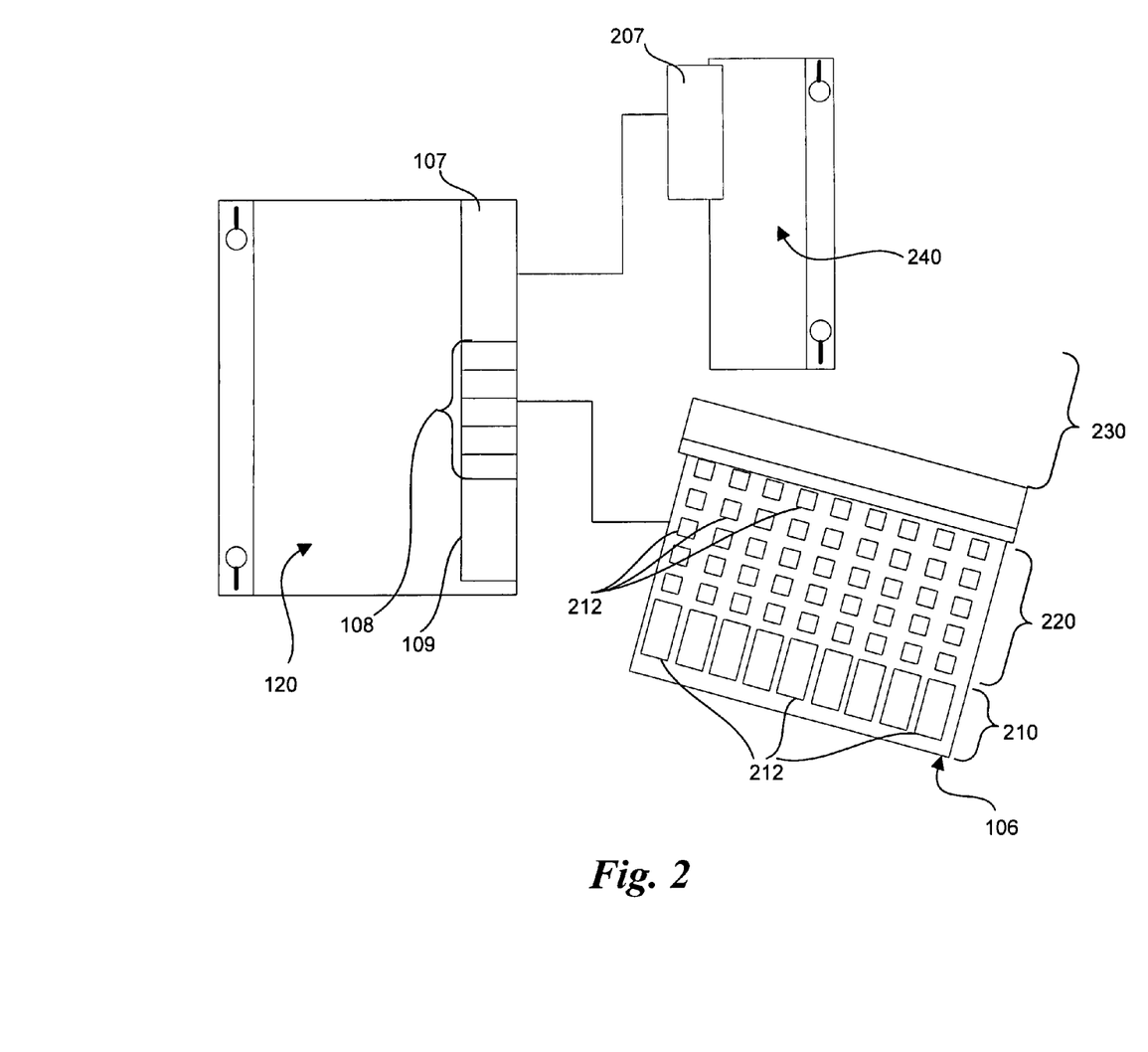
FIG. 2 provides an exploded view of an example board, backplane and rear transition module (RTM), according to one embodiment.

FIG. 2 provides an exploded view of an example board 120, backplane 106 and RTM 240, according to one embodiment. In this example embodiment, board 120 may be coupled to both backplane 106 and RTM 240 within modular platform 100.

As mentioned above, modular platform 100 may be a telecommunications server designed to be compliant with the ATCA Specification. According to one aspect of the ATCA Specification, three different interface zones are described within the specification where components (e.g., boards and/or modules) are coupled to a modular platform backplane or to each other. For example, the three zones described in the ATCA Specification are depicted, at least in part, as zones 210, 220 and 230 in FIG. 2.

In an example embodiment, zone 210 includes power connectors 212 to distribute power to components coupled to backplane 106. Zone 220 includes I/O connectors 222. I/O connectors 222 may provide data transport interfaces to route I/O signals. For example, I/O connector 108 on board 120 may couple to I/O connector 222 to enable communications between board 120 and modular platform 100 system management devices, other boards coupled to I/O connectors 220, or electronic systems located remotely to modular platform 100.

Zone 230 is the area above backplane 106 where RTM modules may couple to components that are also coupled to backplane 106. In an alternative embodiment, zone 230 may also include RTM interfaces located on extensions (not shown in FIG. 2) to backplane 106. As described in more detail below, these extensions may enable an RTM to connect directly to the backplane and provide additional functionality to backplane 106 (e.g., provide power or data transport interfaces).

In FIG. 2, RTM 240 is shown including connector 207. In an example embodiment, when board 120 is coupled to both backplane 106 and RTM 240, connector 207 may couple to RTM interface 107. This coupling between connector 207 and RTM interface 107 may occur in zone 230. An example of this is illustrated more clearly with reference to FIG. 3.

Figure 3:
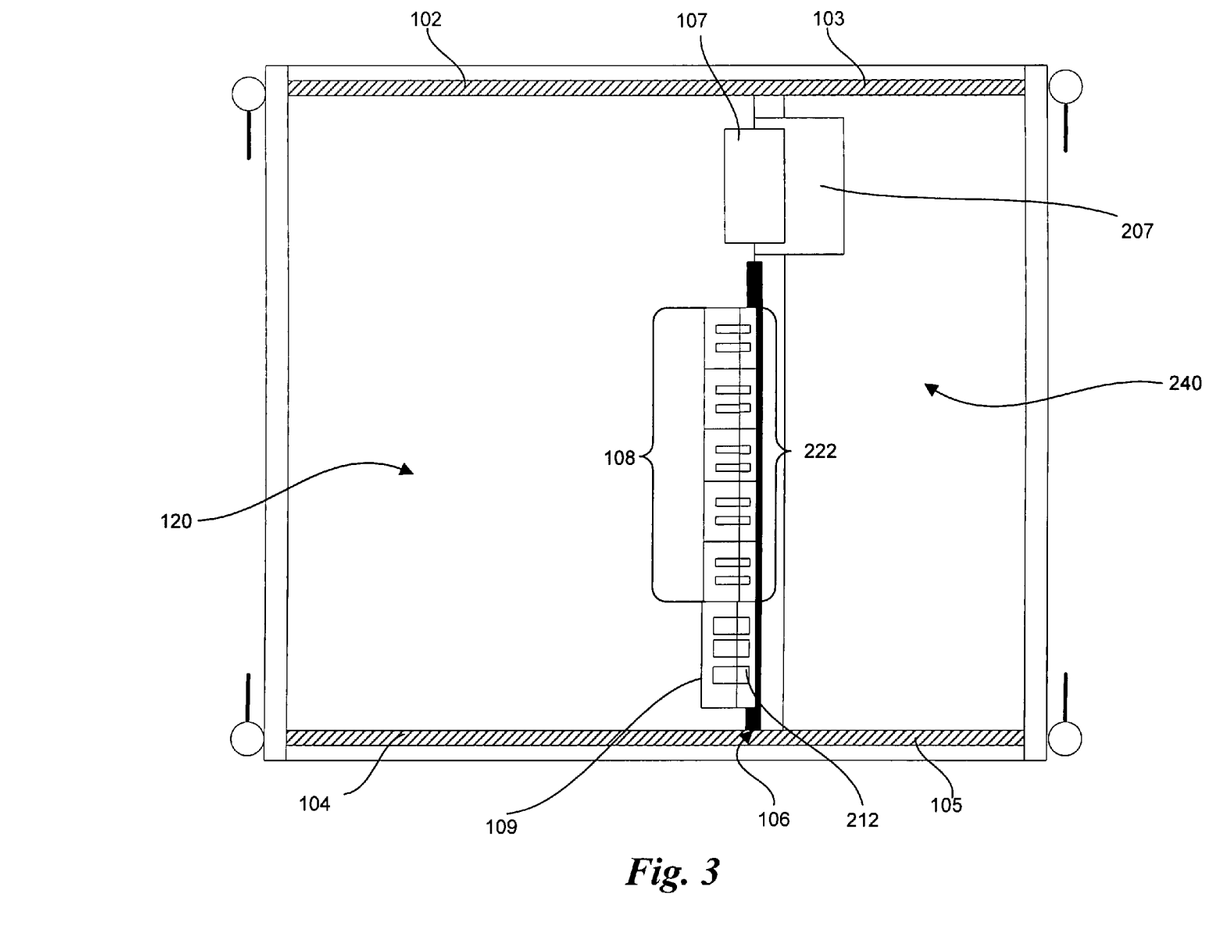
FIG. 3 provides a side view of an example portion of a modular platform, according to one embodiment.

Turning briefly to FIG. 3, a side view of an example portion of modular platform 100 is presented. In particular, FIG. 3 is provided to show the physical relationship between board 120, backplane 106 and RTM 240, when board 120 is coupled to both backplane 106 and to RTM 240, according to one embodiment. In this example embodiment, RTM 240 is coupled to board 120 through RTM interface 107 but is not coupled to an interface on backplane 106.

Figure 4:
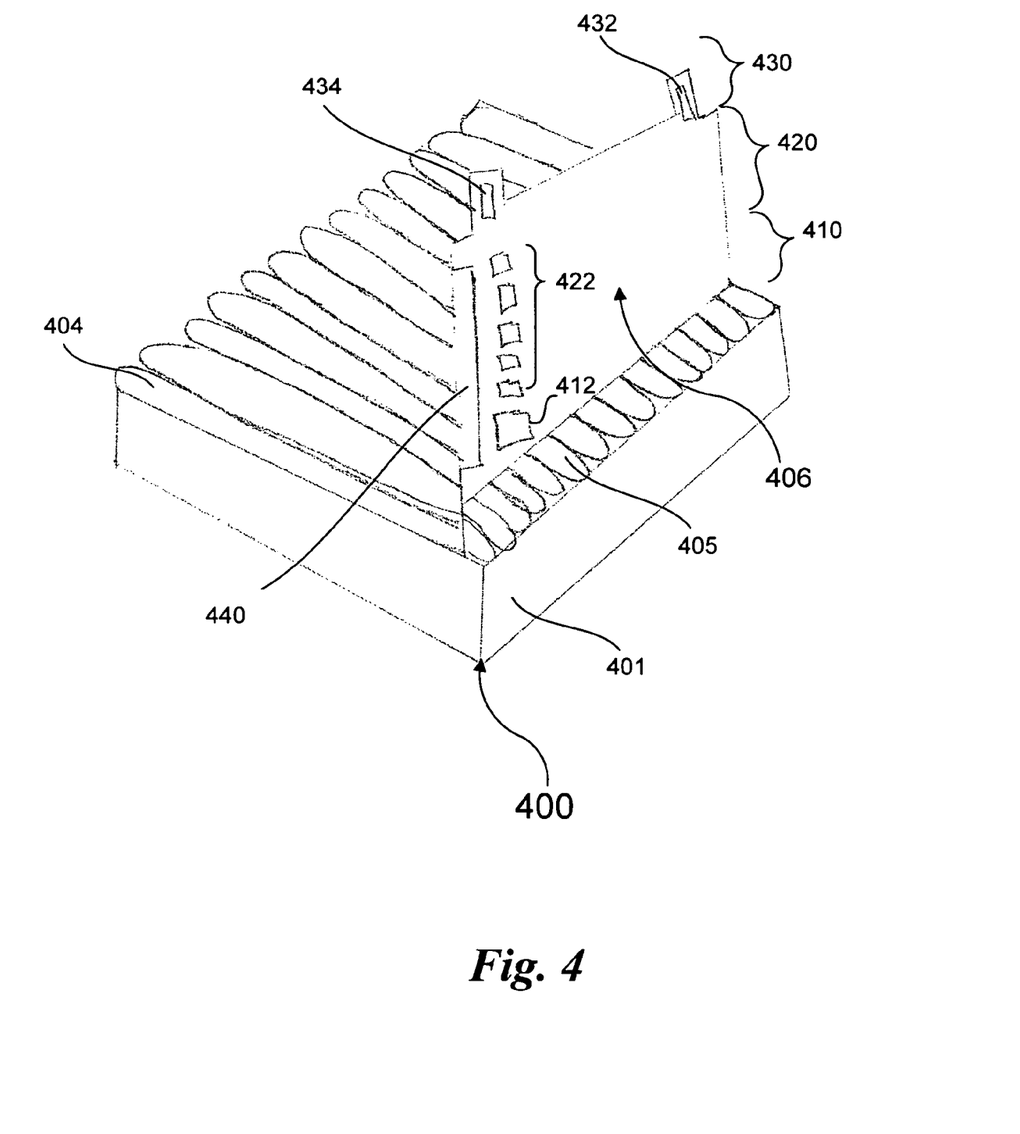
FIG. 4 provides a partial view of an example modular platform with a u-shaped backplane, according to one embodiment.

FIG. 4 provides a partial view of an example modular platform 400 with a u-shaped backplane 406, according to one embodiment. Modular platform 400 may be a telecommunications server designed to be compliant with the ATCA Specification. In this regard, according to one example embodiment, u-shaped backplane 406 may include interfaces in the three zones (e.g., zones 410, 420 and 430) described in the ATCA Specification. FIG. 4 shows a partial view of modular platform 400 having selected portions removed for clarity.

Modular platform 400 may include lower board guide 404, lower RTM guide 405 and lower plenum 410. Although not shown in FIG. 4, modular platform 400 may also include upper board guide, upper RTM guide and an upper plenum. To allow for clarity, the upper guides and plenum are not shown.

In an example embodiment, zone 410 includes power connectors 412 to distribute power to components (e.g., board 120) coupled to backplane 406. Zone 420 includes I/O connectors 422. I/O connectors 422 provide data transport interfaces to route I/O signals for components coupled to backplane 406. To allow for clarity, only one vertical row of I/O, connectors 422 and power connects 412 is shown in FIG. 4. Zone 430 includes RTM interfaces 432 and 434. In an example embodiment, RTM interfaces 432 and 434 receive and couple an RTM to backplane 406 to provide additional functionality to backplane 406 (e.g., power and/or data transport interfaces). As described in more detail below, an RTM that provides additional functionality by providing power to backplane 406 is hereinafter referred to as a rear transition power entry module or "RT-PEM."

In an example embodiment, backplane 406 may also include a shelf manager interface 440. A shelf manager (not shown) may be received and coupled to backplane 406 through shelf manager interface 440. The shelf manager, for example, may provide system management functionality to modular platform 400.

Figure 5:
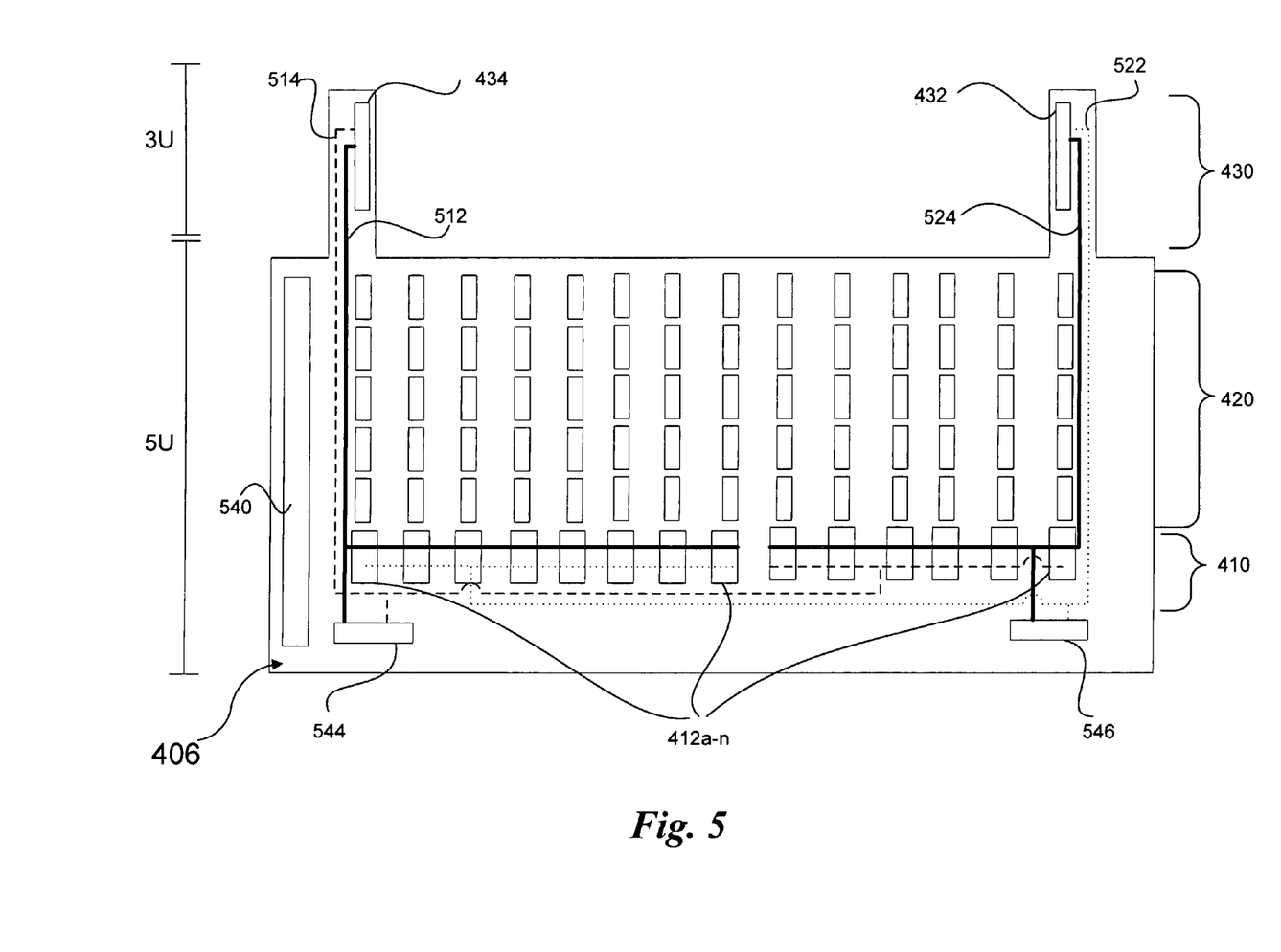
FIG. 5 illustrates an example power delivery configuration for a u-shaped backplane, according to one embodiment.

FIG. 5 illustrates an example power delivery configuration for u-shaped backplane 406, according to one embodiment. In an example embodiment, backplane 406 includes power connectors 412 in zone 410. Power connectors 412 may include a number (e.g., fourteen (14)) of power connectors 412a-412n. Power connectors 412a-412n, in an example embodiment, may distribute power from backplane 406 to components (e.g., boards and/or modules) coupled to backplane 406.

In an example embodiment, backplane 406 may include power circuitry 512, 514, 522 and 524. This power circuitry may provide dual, redundant power feeds from RTM interfaces 432 and 434 to power connectors 412a-412n. As shown in FIG. 5, power circuitry 512 and 522 may provide power feeds to route power to power connectors 412a-412g. Power circuitry 514 and 524 may provide power feeds to route power to power connectors 412h-412n.

As introduced above, RT-PEMs may be received by and coupled to RTM interfaces 432 and 434. When coupled, the RT-PEMs may provide an interchangeable or modular power source for backplane 406. In an example implementation, RT-PEMs may include but are not limited to power modules that may provide −48 volts direct current (VDC) power feeds to backplane 406.

In an example embodiment, power circuitry 512, 514, 522 and 524 may also provide dual, redundant power feeds from power entry module (PEM) connectors 544 and 546 to power connectors 412a-412n. PEM connectors 544 and 546 may couple to a PEM that is not coupled directly to backplane 406. Rather, the PEM is coupled via some other interface, e.g., a power cable (not shown). In example implementation, PEMs may include, but are not limited to, power modules that provide −48 VDC to backplane 406.

In an alternative embodiment, backplane 406 may not include PEM connectors 544 and 546. Thus, power is provided to backplane 406 through one or more RT-PEMs received and coupled to RTM interface 432 and/or RTM interface 434.

In an example embodiment, backplane 406 is designed to comply with the dimensional constraints described in the ATCA Specification. In accordance with the illustrated example implementation of an ATCA compliant backplane 406 in FIG. 5, a typical dimensional constraint may be the total height of the modular platform. For example, a modular platform (e.g., modular platform 400) containing components coupled to a backplane (e.g. backplane 406) may be constrained to a total vertical height of eight units (or 8 U). In this example, a "U" is a unit of measure associated with the vertical height of a backplane equal to 1.75 inches, or 44.45 millimeters. Thus, an 8 U height constraint equates to a height limit of 14 inches, although the invention is not limited to backplanes with an 8 U height constraint.

In an example embodiment, the portions of backplane 406 including zones 410 and 420 may have a height of 5 U. To meet the 8 U ATCA height constraint, the portion of backplane 406 that includes Zone 430 is less than 3 U in height. Thus, the total height of backplane 406 that includes zones 410, 420 and 430 may be less than 8 U in height.

Figure 6:
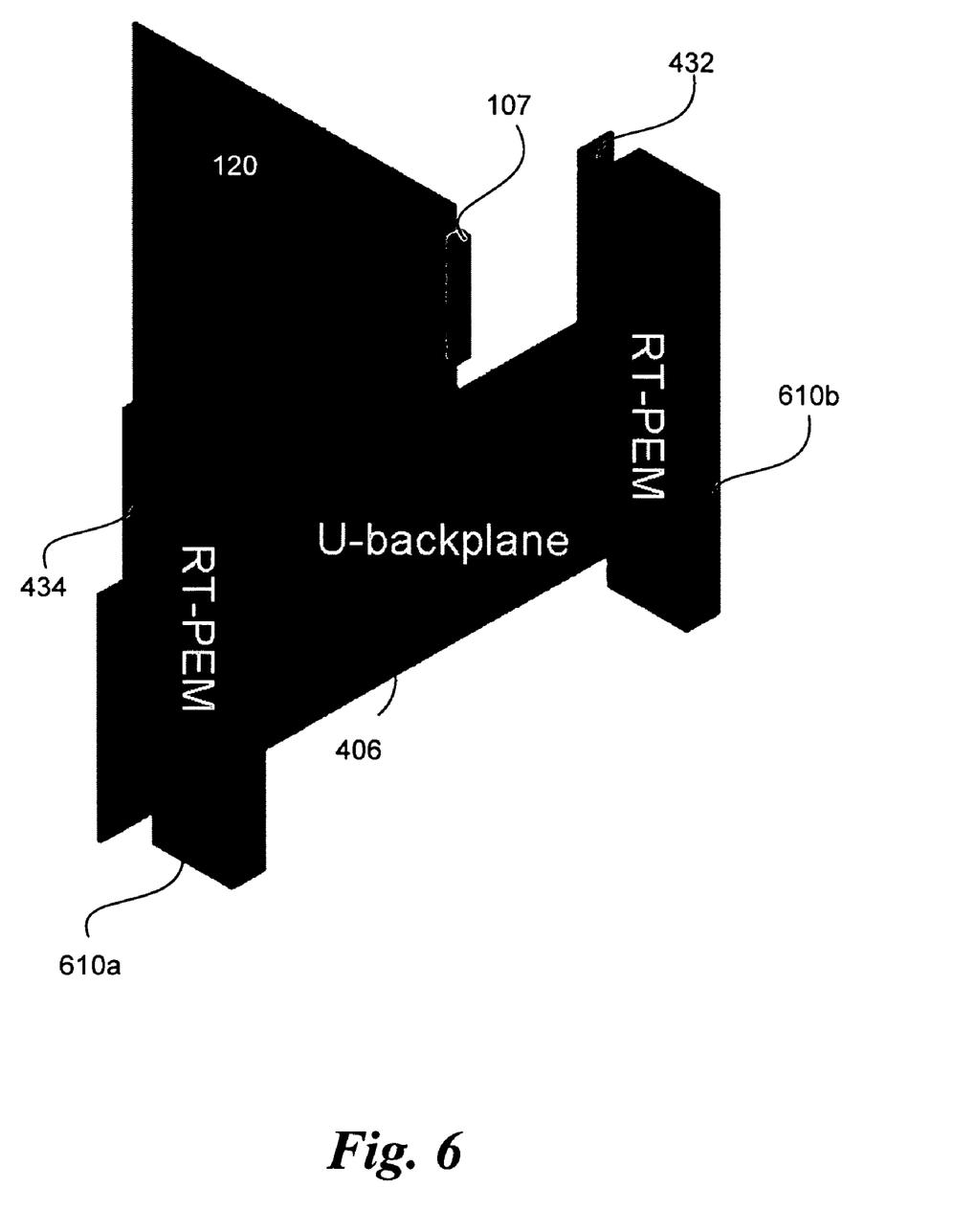
FIG. 6 is an example isometric view of a board and RT-PEMs connected to a u-shaped backplane, according to one embodiment.

FIG. 6 is an example isometric view of board 120 and RT-PEMs 610a and 610b connected to u-shaped backplane 406, according to one embodiment. In an example embodiment, RT-PEMs 610a and 610b are coupled directly to backplane 406 through RTM interfaces 432 and 434 without the use of power cables.

As introduced above, RT-PEMs may provide an interchangeable and/or modular power source for components coupled to a backplane (e.g., backplane 406) in a modular platform. For example, RT-PEMs 610a and 610b may include power modules (not shown) that provide power to backplane 406. In an example embodiment, RT-PEMs may include a power module that may provide direct current (DC) power to backplane 406. In an example implementation, RT-PEMs may also include a power module with an AC/DC power converter (not shown). The AC/DC power converter, for example, may convert power from an alternating current (AC) power source (e.g., a 120 Volt AC power source) to provide DC power to backplane 406, although the invention is not limited in this regard.

Figure 7:
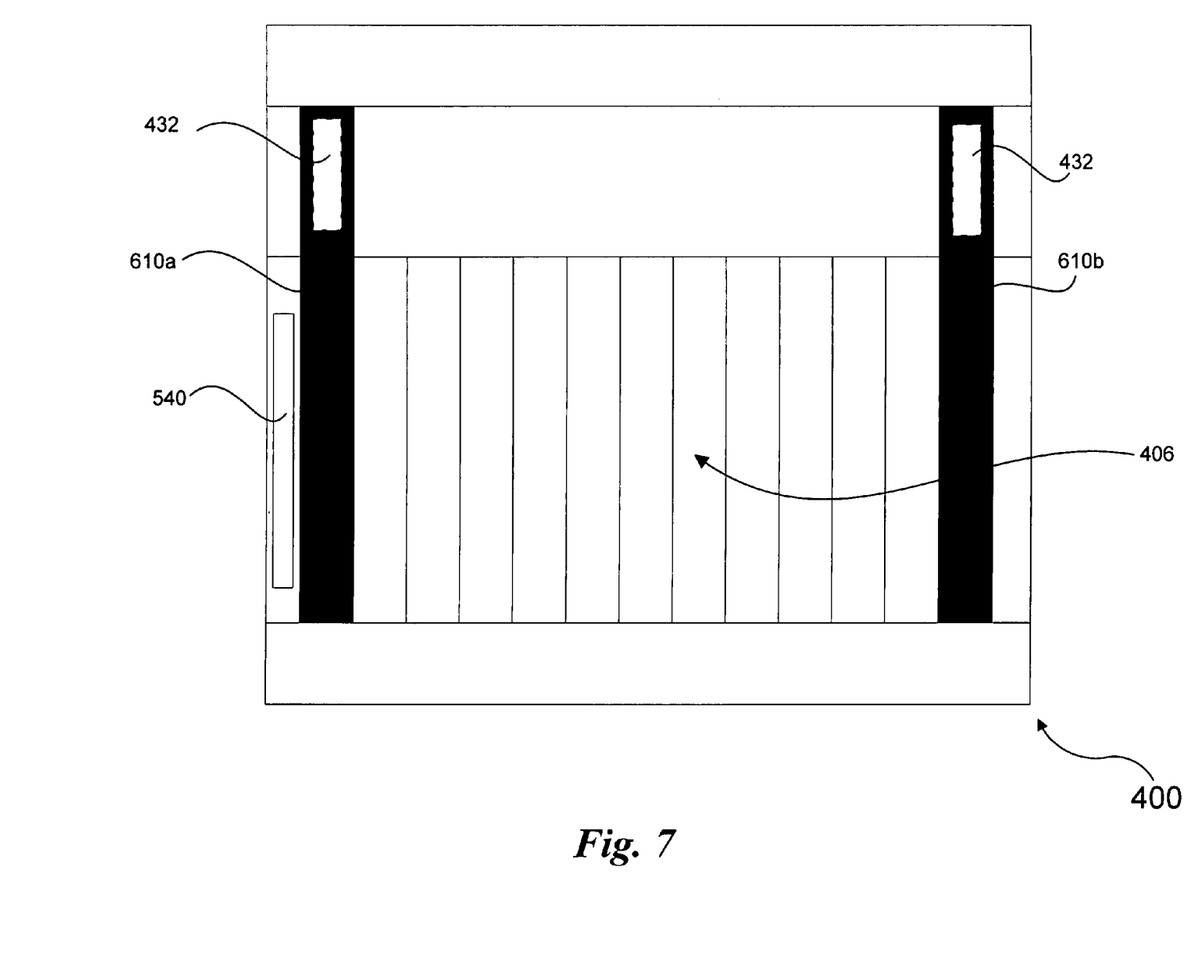
FIG. 7 is a rear view of an example modular platform with two RT-PEMs coupled to a backplane, according to one embodiment.

FIG. 7 is a rear view of an example modular platform 400 with RT-PEMs 610a and 610b coupled to backplane 406, according to one embodiment. The rear view of modular platform 400 shows RT-PEMs received by and coupled to RTM interfaces 432 and 434 to provide power to backplane 406. In FIG. 7, no other RTMs or boards are shown as coupled to backplane 406.

Figure 8:
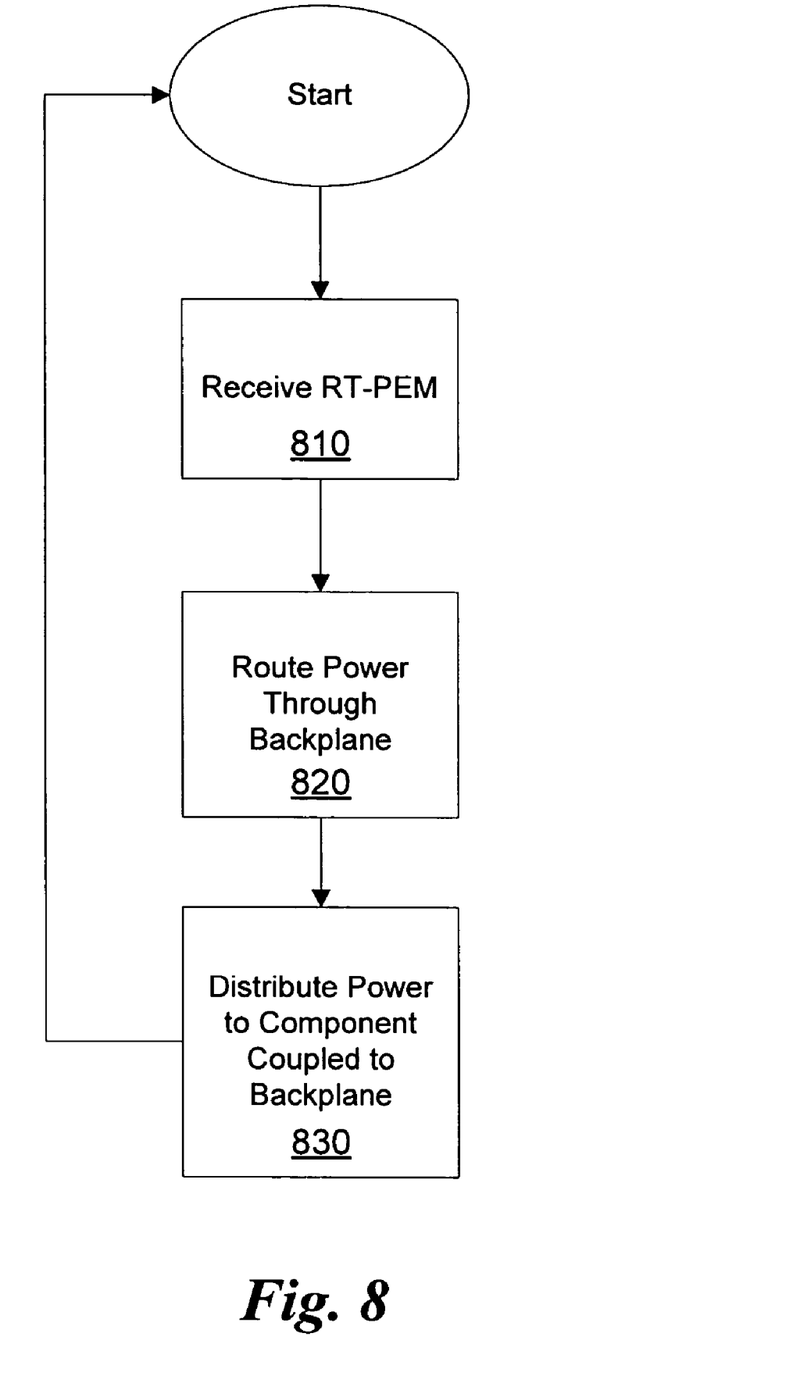
FIG. 8 is a flow chart of an example method to provide power to a backplane, according to one embodiment.

FIG. 8 is a flow chart of an example method to provide power to a backplane, according to one embodiment. The process begins in block 810, where according to an example embodiment, RT-PEM 610a (as shown in FIG. 6) may be received and coupled to RTM interface 432 of backplane 406. In an example implementation, RTM interface 432 may be located in zone 430 of backplane 406. Once coupled, power may be received through RTM interface 432 from RT-PEM 610a.

In block 820, according to an example embodiment, at least a portion of the power received from RT-PEM 610a may be routed to each power interface located in zone 410 of backplane 406. For example, at least a portion of the power received from RT-PEM 610a is routed through power circuitry 512 and 514. The at least a portion of power may then be routed to power connectors 412a-n.

In block 830, according to an example embodiment, the power interface may further distribute at least a portion of the power to a component (e.g., board 120) coupled to backplane 406. The process may then start over if another RT-PEM (e.g., RT-PEM 610b) is to be received and coupled to backplane 406 in zone 430 or if another RTM containing a power module is to be received and coupled to backplane 406 in zone 430.

In the previous descriptions, for the purpose of explanation, numerous specific details were set forth in order to provide a thorough understanding of the invention. It will be apparent, however, to one skilled in the art, that the invention can be practiced without these specific details. In other instances, structures and devices were shown in block diagram form in order to avoid obscuring the invention.

References made in the specification to "one embodiment" or "an embodiment" means that a particular feature, structure or characteristic described in connection with that embodiment is included in at least one embodiment of the invention. Thus, the appearances of the phrase "in one embodiment" appearing in various places throughout the specification are not necessarily all referring to the same embodiment. Likewise, the appearances of the phrase "in another embodiment," or "in an alternate embodiment" appearing in various places throughout the specification are not all necessarily referring to the same embodiment.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative of, rather than limiting the scope and coverage of the claims appended hereto.

What is claimed is:

1. A backplane for a modular platform, comprising: a power interface to distribute power to a component coupled to the backplane; an interface to receive and couple a rear transition power entry module (RT-PEM) to the backplane; and power circuitry to route power to the power interface, wherein the power is received from the RT-PEM and wherein the RT-PEM is capable of supplying power to all components coupled to the backplane and wherein a lower zone of the backplane comprises air vents to provide air flow within the modular platform, wherein the power interface is located in a lower zone and the interface to receive and couple the RT-PEM is located in an upper zone of the backplane and wherein the backplane is compliant with an Advanced Telecommunications Computing Architecture Base Specification, PCI Industrial Computer Manufacturers Group 3.0 Rev. 1.0, wherein the upper zone includes zone 3 and the lower zone includes zone 1, wherein another interface to receive and couple another RT-PEM to the backplane; and additional power circuitry to route power to the power interface, wherein the power is received from the other RT-PEM, wherein the power circuitry and the additional power circuitry provide redundant power feeds to the cower interface.

2. A backplane for a modular platform according to claim 1, further comprising:
another interface to receive and couple another RT-PEM to the backplane; and
additional power circuitry to route power to the power interface, wherein the power is received from the other RT-PEM.

3. A backplane for a modular platform according to claim 2, wherein the power circuitry and the additional power circuitry provide redundant power feeds to the power interface.

4. A system comprising: a modular platform; a rear transition power entry module (RT-PEM) including a power module; and a backplane coupled to the modular platform, the backplane further comprising: a power interface to distribute power to a component coupled to the backplane; an interface to receive and couple the RT-PEM to the backplane; and power circuitry to route power received from the RT-PEM power module to the component, wherein the RT-PEM is capable of supplying power to all components coupled to the backplane and wherein a lower zone of the modular platform comprises air vents to provide air flow within the modular platform, wherein the power module comprises an alternating current to direct current (AC/DC) power converter, wherein the modular platform is compliant with an Advanced Telecommunications Computing Architecture Base Specification, PCI Industrial Computer Manufacturers Group 3.0 Rev. 1.0, wherein the interface to receive and couple the RT-PEM comprises the interface located in zone 3 on the backplane, wherein the power interface to distribute power to the component comprises the power interface located in zone 1 on the backplane and the power circuitry provides a power feed from the interface located in zone 3 to the power interface located in zone 1.

5. A system according to claim 4, wherein the modular platform is compliant with an Advanced Telecommunications Computing Architecture Base Specification, PCI Industrial Computer Manufacturers Group 3.0 Rev. 1.0.

6. A system according to claim 5, wherein the interface to receive and couple the RT-PEM comprises the interface located in zone 3 on the backplane.

7. A system according to claim 6, wherein the power interface to distribute power to the component comprises the power interface located in zone 1 on the backplane and the power circuitry provides a power feed from the interface located in zone 3 to the power interface located in zone 1.

* * * * *

UNITED STATES PATENT AND TRADEMARK OFFICE
CERTIFICATE OF CORRECTION

PATENT NO.        : 8,189,343 B2
APPLICATION NO.   : 11/023776
DATED             : May 29, 2012
INVENTOR(S)       : Wen Wei et al.

It is certified that error appears in the above-identified patent and that said Letters Patent is hereby corrected as shown below:

In column 6, line 34, in claim 1, delete "cower" and insert -- power --, therefor.

Signed and Sealed this
Seventh Day of August, 2012

David J. Kappos
*Director of the United States Patent and Trademark Office*